(12) United States Patent
Zhou

(10) Patent No.: US 6,172,409 B1
(45) Date of Patent: Jan. 9, 2001

(54) BUFFER GRATED STRUCTURE FOR METROLOGY MARK AND METHOD FOR MAKING THE SAME

(75) Inventor: Hao Zhou, Aliso Viejo, CA (US)

(73) Assignee: Cypress Semiconductor Corp., San Jose, CA (US)

(*) Notice: Under 35 U.S.C. 154(b), the term of this patent shall be extended for 0 days.

(21) Appl. No.: 08/883,625

(22) Filed: Jun. 27, 1997

(51) Int. Cl.[7] .................................................. H01L 23/544
(52) U.S. Cl. .......................... 257/620; 257/797; 438/401; 438/462
(58) Field of Search .................................. 438/401, 462, 438/965; 257/797, 620

(56) References Cited

U.S. PATENT DOCUMENTS

| 4,936,930 | 6/1990 | Gruber et al. ...................... 148/33.4 |
| 4,981,529 | 1/1991 | Tsujita ................................. 148/33 |
| 5,198,390 | 3/1993 | MacDonald et al. ............... 437/203 |
| 5,234,868 | 8/1993 | Cote .................................... 437/225 |
| 5,314,843 | 5/1994 | Yu et al. ............................. 437/225 |
| 5,401,961 | 3/1995 | Caldwell ............................ 437/228 |
| 5,503,962 | 4/1996 | Caldwell ............................ 430/317 |
| 5,523,254 | 6/1996 | Satoh et al. ......................... 437/62 |
| 5,556,808 | 9/1996 | Williams et al. .................... 437/209 |
| 5,622,899 | 4/1997 | Chao et al. .......................... 438/9 |
| 5,627,110 | 5/1997 | Lee et al. ............................ 438/692 |
| 5,763,057 | * 6/1998 | Sawada et al. ...................... 428/209 |
| 5,777,392 | * 7/1998 | Fujii .................................... 257/797 |
| 5,786,260 | * 7/1998 | Jang et al. .......................... 438/401 |
| 5,801,090 | 9/1998 | Wu et al. ............................ 438/622 |
| 5,834,829 | * 11/1998 | Dinkel et al. ........................ 257/620 |
| 5,923,996 | 7/1999 | Shih et al. ........................... 438/462 |
| 6,020,263 | 2/2000 | Shih et al. ........................... 438/692 |
| 6,049,137 | 4/2000 | Jang et al. ........................... 257/797 |

* cited by examiner

Primary Examiner—Olik Chaudhuri
Assistant Examiner—Kurt Eaton
(74) Attorney, Agent, or Firm—Christopher P. Maiorana, P.C.

(57) ABSTRACT

A semiconductor wafer is disclosed including a set of alignment marks and buffer structure. The buffer structure may collect or trap fabrication and/or processing materials and/or contaminants that may arise in the further fabrication steps and that may adversely affect the alignment marks. The buffer structure thus helps to preserve the alignment marks such that, e.g., lithographic masks used in fabricating the semiconductor wafer may be accurately aligned during further processing.

20 Claims, 3 Drawing Sheets

BUFFER GRATED STRUCTURE FOR METROLOGY MARK AND METHOD FOR MAKING THE SAME

FIELD OF THE INVENTION

The present invention relates to a photolithographic alignment process generally, and more particularly, to a buffer structure for a metrology mark to improve a photolithography alignment process that is compatible with Chemical Mechanical Polishing.

BACKGROUND OF THE INVENTION

In integrated circuit manufacturing, large scale integration (LSI) or very large scale integration (VLSI) techniques may be used to fabricate complex electrical circuits on a semiconductor substrate. The design and manufacture of many devices have been made possible by reductions in circuit dimensions. A photolithography step is frequently utilized to transfer a pattern for an electrical circuit layer from a photomask to a silicon wafer. Various photolithographic systems use a variety of transfer techniques, including step-and-repeat processes, to gradually transfer a mask pattern from a macroscopic prototype to a microscopic implementation.

Alignment marks are typically created in the silicon substrate and/or in layers of material formed thereon as reference coordinate(s) to improve overlay measurement accuracy and/or to compensate for processing inaccuracies. The alignment marks are created by various processing steps and may be located in the scribe lines of the semiconductor wafer. The scribe lines are the strips of a wafer between integrated circuit (IC) dice where the semiconductor wafer is cut. This area generally is not used for functional IC componentry because such componentry may be destroyed during cutting.

Global alignments between mask layers are generally done by measuring contrasts in light intensities reflected back from the steps created by the elevated portions of the alignment marks. Generally, as long as the step heights in the alignment marks are preserved through subsequent processing steps, global alignment in masking steps (compared to the masking layers) can be achieved. As critical dimensions (CD) of individual transistors transferred from a masked pattern shrink, global planarization at the wafer level becomes advantageous.

Chemical Mechanical Polishing (CMP) is an industry-recognized process. The CMP process is used to achieve global planarization (planarization of the entire wafer). Both chemical and mechanical forces result in a polished wafer. CMP apparatuses generally include an automated rotated polishing platen and a wafer holder. The wafer holder is generally used to hold the wafer in place while the platen exerts a force on the wafer. At the same time, the wafer and platen may be independently rotated. A polishing slurry may be applied to the polishing pad and/or the wafer. The polishing pad contacts relatively high spots on the wafer and, in conjunction with the slurry, removes material from the relatively high spots on the wafer. Planarization occurs because the high spots on the wafer polish faster than low spots on the wafer. Thus, the relatively high portions of the wafer are smoothed to a uniform level faster than the other, relatively low portions of the wafer.

After CMP, the various portions of the wafer, including the alignment marks, may become covered with a relatively flat material. Planarizing the alignment marks or materials covering the alignment marks may create problems for providing proper alignment during subsequent masking steps.

One typical way to get around planarizing problems is to perform a process called "open frame" which reproduces the step height in the alignment marks. This, however, may introduce extra and/or costly steps in the fabrication of the wafer.

Tungsten deposition and the CMP process are typically used to fabricate tungsten contacts. Thus, tungsten CMP (WCMP) is one notable variation of the CMP process. Tungsten is generally preferred to aluminum for contacts due to step coverage problems that arise in high aspect ratio holes during aluminum deposition.

After tungsten deposition, the original alignment marks may be covered with a layer of tungsten film. The grain quality of the tungsten film typically produces poor light reflection quality and, therefore, makes alignment of the mask pattern difficult to control.

Furthermore, WCMP (or any type of CMP) uses particulate matter (usually in the form of a silica and/or alumina slurry) to polish wafers. Such particulate matter (and/or particulate matter generated by CMP) may become trapped between structural features of the alignment marks. In addition, alignment mark structures are typically located in areas of the wafer not having other structural features nearby (e.g., an open frame die or a scribe line). Consequently, the outermost edge of an alignment mark structure being polished may be polished at a slightly faster rate or at a slightly greater pressure than the remainder of the structure, thus increasing the risk of changing the angle of light reflected from the mark, in turn increasing the likelihood and magnitude of measurement errors. As a result, alignment marks may be rendered ineffective after CMP, and particularly after the WCMP process.

SUMMARY OF THE INVENTION

Accordingly, a semiconductor wafer is disclosed including a mark formed in an area of the semiconductor wafer. The mark defines an outer boundary. The semiconductor wafer also includes a buffer structure in the semiconductor wafer between the outer boundary of the mark and one or more other structures on the wafer. The buffer structure inhibits or prevents subsequent processing steps from adversely affecting light-based measurements using the mark (e.g., minimizing the risk of alignment errors resulting from particles and/or uneven polishing).

One advantage associated with the present invention is the ability to process the semiconductor wafer without substantially adversely affecting the mark used to align the semiconductor wafer during processing. Another advantage associated with the present invention is the ability to maximize the area of the semiconductor wafer dedicated to functional circuitry by locating the alignment mark(s) in a scribe line having a state-of-the-art width. Yet another advantage associated with the invention is the ability to quickly align the semiconductor wafer during fabrication without employing processing steps unique to alignment mark creation, thus reducing the fabrication time and costs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
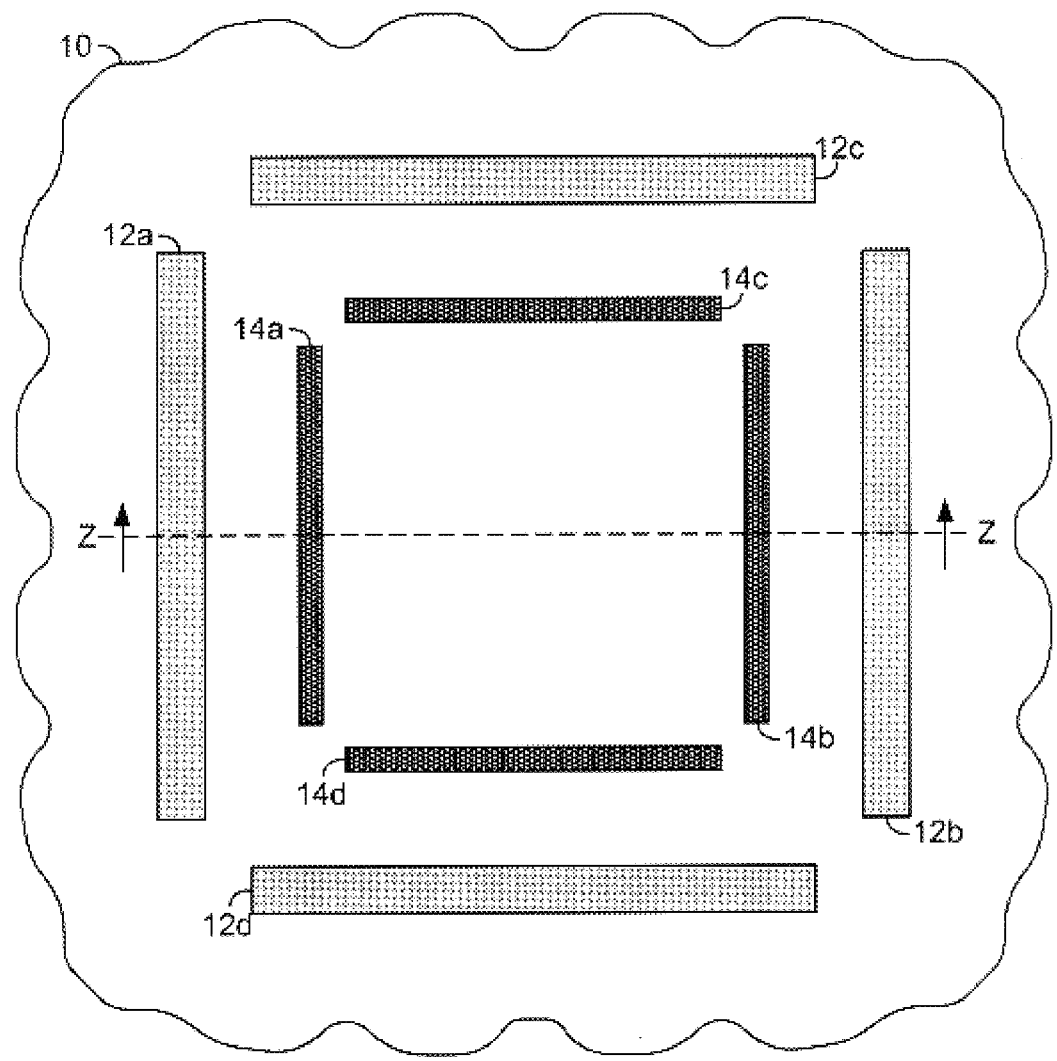
FIG. 1 is a top view of an exemplary alignment structure used in fabricating a semiconductor wafer.

FIG. 1 shows an area of a semiconductor wafer 10 including a first set of alignment marks 12a–12d. In the embodiment shown, the first set of marks 12a–12d may be considered an alignment structure from which measurements and/or subsequently formed alignment marks may be made. The f first set of alignment marks 12a–12d generally may include one or more discrete marks. It may be more preferable to include two or three discrete marks. It may be, however, most preferable to include four or more marks in the first set of alignment marks 12a–12d.

The shape of each discrete mark of a set of alignment marks may vary with the design of the IC. A non-exhaustive list of shapes for a discrete mark may include a square, a rectangle, an L-shape, a T-shape, a cross and the like. The discrete marks may be geometrically arranged (e.g., a group of two or more parallel or perpendicular lines, a group of four to nine evenly-spaced square marks with outer edges aligned, forming a larger square or rectangular-shaped structure; etc.). FIG. 1 shows a first group of marks consisting of two parallel lines 12a and 12b, and a second group of marks consisting of two other parallel lines 12c and 12d perpendicular thereto.

Dimensions for the rectangle shape include a length which is greater than or equal to one micron and a width which is less than or equal to five microns, such that the length is greater than the width. More preferably, the length may be greater than or equal to ten microns, and the width may be less than or equal to two microns. Most preferably, the length for the rectangle shape may be greater than or equal to fifteen microns, and the width may be less than or equal to one micron. The most preferred embodiment of the rectangle shape may also be referred to as a "line." The thickness of the structure(s) in a discrete mark is preferably the same thickness of the structures in the corresponding layer of componentry.

The semiconductor wafer 10 may also include a second mark. In one embodiment, the semiconductor wafer 10 may include a second set of marks 14a–14d. The first and second sets of marks 12a–12d and 14a–14d are used to align the semiconductor wafer 10 during subsequent fabrication (e.g., photolithography) steps.

The semiconductor wafer 10 generally includes a substrate layer which may have a field oxide layer (e.g., $SiO_2$ or silicon dioxide) and/or a gate material layer (e.g., Si or N-doped Si) deposited thereon. The first (set of) alignment mark(s) 12a–12d may comprise the gate material and may be formed at the same time as the gate layer. The semiconductor wafer 10 may include any of the materials known to those of ordinary skill in the art to be useful for semiconductors and/or integrated circuits, such as silicon; silicon lightly and/or heavily doped with N-type dopants (such as phosphorus, arsenic and/or antimony) and/or P-type dopants (such as boron) according to conventional doping processes; germanium, gallium arsenide, and/or aluminum gallium arsenide; and mixtures thereof (e.g., silicon germanium). The semiconductor wafer 10 may further include an insulator base, thus forming a so-called "semiconductor-on-insulator" or "SOI" device.

During fabrication, a first reflective layer is deposited on the semiconductor wafer 10. The first set of marks 12a–12d may be created in this first layer. The first layer may also be useful for other functions, such as providing transistor gates, resistors, electrical interconnections between electrical components, contacts or vias (interconnecting other electrically conductive layers), or a combination thereof. The first layer may comprise polysilicon, doped polysilicon, a metal silicide (such as aluminum silicide, titanium silicide, tungsten silicide, molybdenum tungsten silicide, etc.), a metal (such as aluminum, titanium, copper, tungsten, alloys thereof, etc.), or mixtures and/or combinations thereof. Once the first layer is polished or etched, a second layer (not shown) may be deposited on the first layer. The second set of marks 14a–14d may be created in this second layer. The second layer may be fabricated, in part, using aluminum or an aluminum compound. Aluminum has a lower melting point than tungsten and does not need CMP for planarization.

Figure 2:
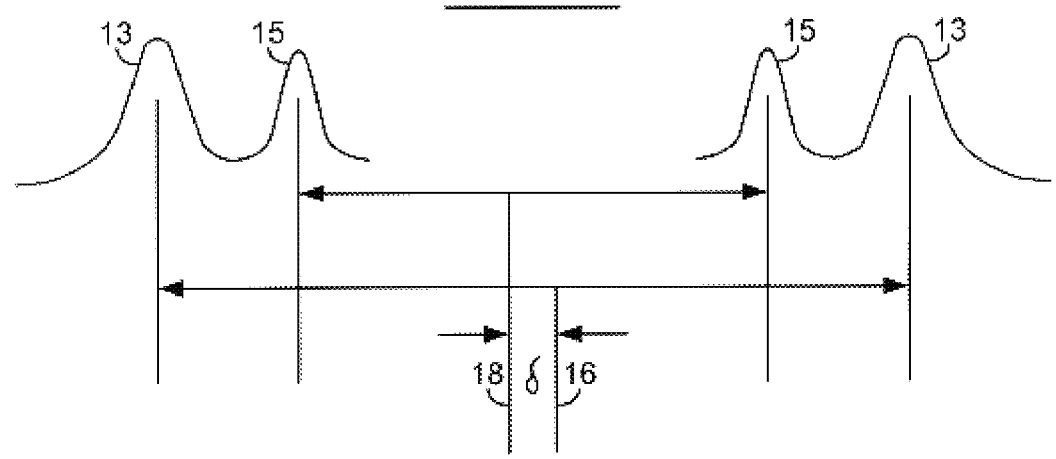
FIG. 2 is a graphic representation of amplitude of absorption of electromagnetic radiation that impinges the alignment structure of FIG. 1.

Referring to FIG. 2, a graphic representation of the amount or amplitude of light reflected or absorbed by the first 12a–12d and second 14a–14d sets of marks is shown. The light may be of the visible spectrum. In practice, the semiconductor wafer 10 is irradiated with light, and the reflection and/or absorption of the radiated light is measured to determine the spacing(s) of the first and second sets of marks 12a–12d and 14a–14d. The lines 13 represent light absorption by the first set of marks 12a–12d, whereas lines 15 represent light absorption by the second set of marks 14a–14d. The spacing of the marks 12a–12d and 14a–14d may be determined by the overlay error δ, which is the difference between the center line 16 of the first lines 13 and the center line 18 of the second lines 15. The center lines 16, 18 may be calculated as the median distance between the centers of each first line 13 and each second line 15, respectively. This information is then used to align subsequent mask patterns with the existing circuit components fabricated in the most recently performed processing step.

As the semiconductor wafer 10 is fabricated, the processes used to fabricate it may degrade the integrity of the alignment marks 12a–12d and 14a–14d. This degradation may prevent the proper alignment of the functional circuitry on the wafer, especially when it may be difficult to determine, with an acceptable and/or predetermined level of certainty, the location of the center of each of the alignment marks 12a–12d and 14a–14d. The CMP or etching process may render precise measurements using the first set of alignment marks 12a–12d difficult.

Figure 3:
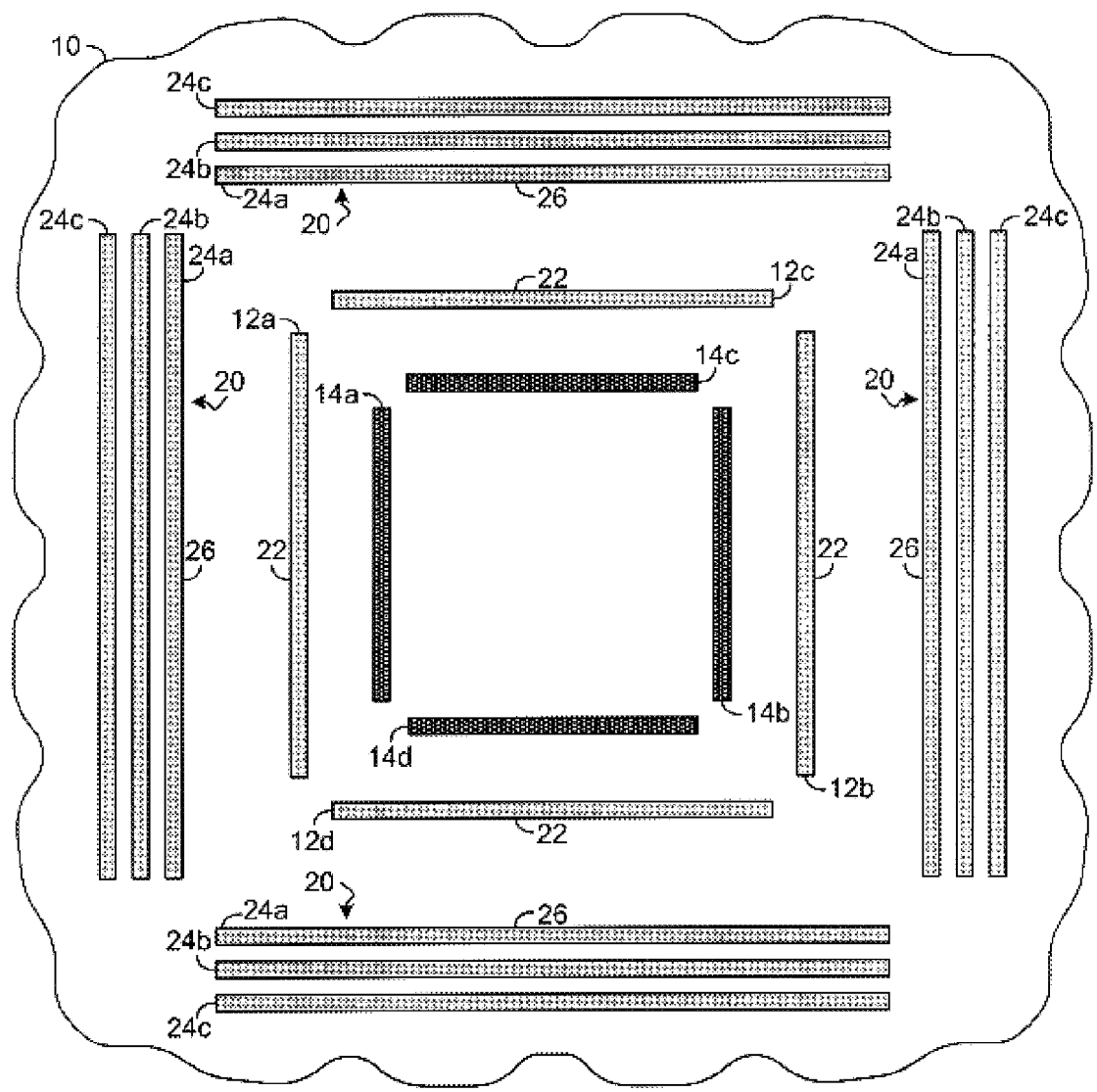
FIG. 3 is a top view of a preferred embodiment of the invention.

Referring to FIG. 3, an embodiment of the invention, a buffer structure, is generally indicated at 20. The buffer structure 20 may be formed or fabricated in the semiconductor wafer 10 in spaced relation to any one of the alignment marks 12a–12d and 14a–14d. In the embodiment shown in FIG. 3, a buffer structure 20 may be fabricated in a scribe line between each of the first set of marks 12a–12d and functional circuitry (not shown).

The buffer structure 20 may prevent or inhibit processing materials and/or slurry from unevenly contacting the alignment marks 12a–12d during the processing or fabrication of the semiconductor wafer 10. For example, the buffer structure may have approximately the same thickness as the first set of alignment marks 12a–12d, resulting in relatively even pressure being applied to the alignment marks 12a–12d during polishing. In addition, the buffer structure may trap slurry particles to inhibit or prevent adverse effects of such particles on the alignment marks 12a–12d and 14a–14d.

In a preferred embodiment, the buffer structure 20 has a length greater than that of any of the alignment marks 12a–12d and 14a–14d. The buffer structure 20 may be disposed adjacent to the outermost surface, edge or boundary 22 of the alignment marks. The buffer structure 20 may allow processing of wafers having operational electrical components close to the alignment marks 12a–12d and 14a–14d. More specifically, the buffer structures 20 buffer, inhibit or prevent materials which may contaminate and/or adversely affect the alignment marks 12a–12d and 14a–14d from contaminating or adversely affecting the alignment marks 12a–12d and 14a–14d.

In one embodiment, an alignment structure comprising one or more sets of alignment marks and one or more buffer structures occupies an area of 10,000 $\mu m^2$ or less, preferably 6,500 $\mu m^2$ or less, more preferably 5,000 $\mu m^2$ or less and most preferably 3,000 $\mu m^2$ or less. In a constructed embodiment (see, e.g., FIG. 3), the alignment structure occupies about 2,480 $\mu m^2$.

Figure 4:
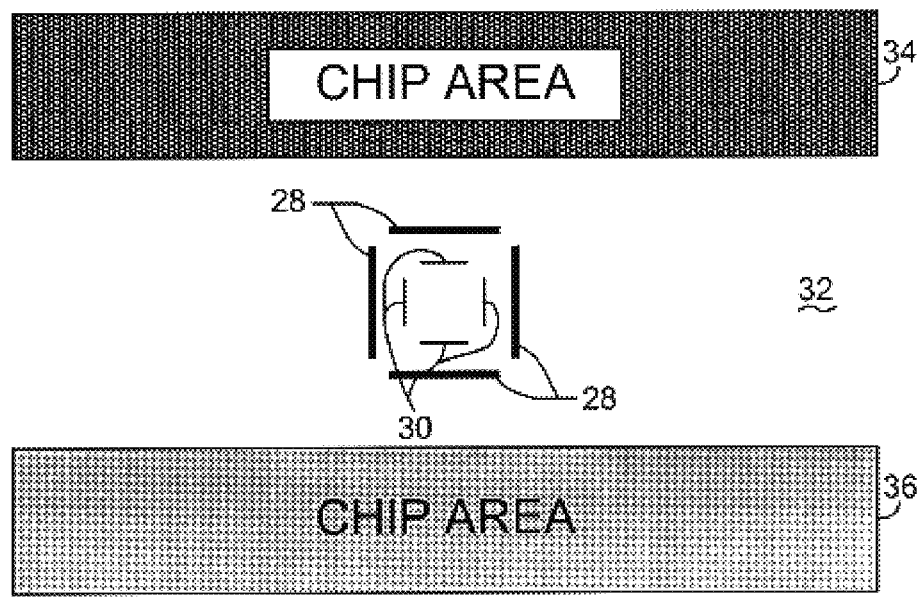
FIG. 4 shows an alignment structure in a scribe line of a semiconductor wafer.
Figure 5:
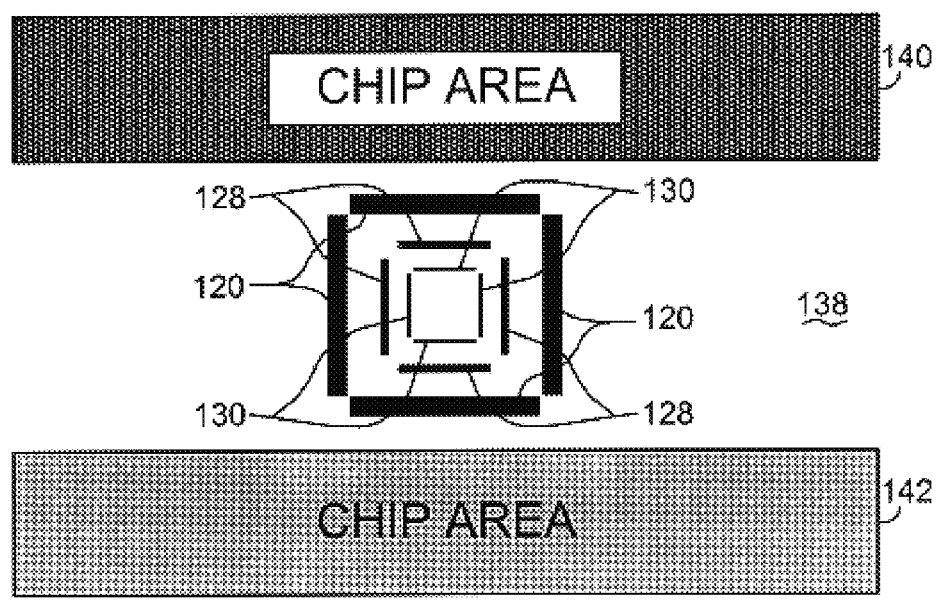
FIG. 5 is an alignment structure surrounded by the preferred embodiment of the invention in a scribe line of a semiconductor wafer.

More specifically, and with reference to FIG. 4, alignment marks 28, 30 are in a scribe line 32 having a width of 120 microns, separating two chip areas 34, 36 having or designed to have functional components therein. Such functional components are typically used in an IC serving one or more of the following functions: logic, memory, controller, processor, power, timing, etc. The outer alignment marks 28 define a separation of thirty microns therebetween. However, as shown in FIG. 5, wherein reference characters offset by 100 represent similar elements as those shown in FIG. 3, the outer alignment marks 128 are twenty five microns apart in a scribe line 138 only sixty microns wide, separating two chip areas 40, 52 of functional components. The buffer structure 20, located no more than twenty five $\mu$m, and preferably 17.5 $\mu$m, from a chip area comprises three parallel lines, one $\mu$m in width and one $\mu$m apart, about five $\mu$m from the chip areas 40, 42, and about 7.5 $\mu$m from the second set of alignment marks 14.

Referring specifically to FIG. 3, the buffer structure 20 may include a grating 24. The grating 24 may generally consist of a plurality of grates 24a, 24b, and 24c extending substantially parallel to each other. The grating 24 may trap or collect particulate materials outside or between the grates 24a, 24b and 24c to avoid damaging the alignment marks 12a–12d and 14a–14d. The width of each grate may be, for example, less than or equal to 1.5 $\mu$m, preferably less than or equal to 1.2 $\mu$m, and more preferably less than or equal to 1.0 $\mu$m. The width of each grate may be as small as 0.18 $\mu$m, preferably 0.25 $\mu$m, 0.35 $\mu$m, or 0.5 $\mu$m. Grates may be independently separated from each other by a distance described above for the grate width. The length of the grates preferably exceeds the corresponding dimension (e.g., length or width) of an adjacent set of alignment marks.

In one embodiment, the grates 24a–24c may be one micron thick and may be separated from each other by a distance of one micron. Each of the plurality of grates 24a–24c extend substantially parallel to the outer boundary 22 of the first set of alignment marks 12a–12d. The buffer structure(s) may be located between the first set of alignment marks 12a–12d and either of (i) an adjacent IC die or (ii) an adjacent alignment structure (in the direction of the scribe line). The innermost portion 26 of the buffer structure 20 may be spaced from the outer boundary 22 of the first set of marks 12a–12d by a distance of from one to fifteen $\mu$m, preferably three to twelve $\mu$m and more preferably four to ten $\mu$m. In a constructed embodiment, the distance is approximately 7.5 $\mu$m. In another embodiment, the grates 24 trace a nonlinear or curved path.

The buffer structures and alignment marks may be created in a local interconnect layer, a contact layer and/or a layer of metal. The buffer structure is preferably fabricated at the same time as the local interconnect or contact layer. The alignment marks are preferably fabricated at the same time as the local interconnect layer and/or the first layer of metal. In a more preferred embodiment, the buffer structure and outer alignment mark(s) are fabricated at the same time as the local interconnect or contact layer, and the inner alignment mark(s) is/are fabricated at the same time as a subsequently formed local interconnect or metal layer. Alternatively, the alignment marks 12a–12d and 14a–14d may be respectively formed in first and second metal layers of the semiconductor wafer 10.

The local interconnect layer may have a thickness from 500 Å to 2,000 Å, and preferably, from 700 Å to 1,500 Å. Subsequent to depositing the local interconnect layer, masking and etching steps may be conventionally conducted to form the local interconnect. The step height of the local interconnect layer may be from 500 Å to 1,600 Å and, preferably, from 800 Å to 1,000 Å.

The method for preserving the measurement structure (i.e., the alignment marks 12a–12d and 14a–14d) during fabrication of the semiconductor wafer 10 may include the steps of forming a buffer structure adjacent to a measurement structure, the measurement structure comprising one or more (preferably two or more) alignment marks, and subsequently fabricating and/or forming one or more layers and/or structures on the wafer (preferably including a CMP and/or photolithography step, more preferably including both a CMP and a photolithography step). Preferably, the buffer structure is formed such that the buffer structure 20 prevents or inhibits contaminants and other materials from adversely affecting subsequent measurements taken using the measurement structure. The method may also include the step of forming the alignment or measurement structure on the semiconductor wafer.

While the present invention has been particularly shown and described with reference to the preferred embodiments thereof, it will be understood by those skilled in the art that various changes in form and details may be made without departing from the spirit and scope of the present invention.

What is claimed is:

1. A semiconductor wafer comprising:

first and second chip areas;

a set of alignment marks between said chip areas, said set of alignment marks having an outer boundary; and a buffer structure including a plurality of grates, located between said chip areas and said outer boundary.

2. A semiconductor wafer as set forth in claim 1 further comprising a second set of alignment marks inside said first set of alignment marks.

3. A semiconductor wafer as set forth in claim 2 wherein said first and second sets of alignment marks have an alignment with respect to each other selected from the group consisting of parallel, perpendicular, and combinations thereof.

4. A semiconductor wafer as set forth in claim 1 wherein said plurality of grates are substantially parallel to each other.

5. A semiconductor wafer as set forth in claim 4, wherein each of said plurality of grates extends substantially parallel to said outer boundary of said set of alignment marks.

6. A semiconductor wafer as set forth in claim 1, wherein each of said plurality of grates is spaced a distance equal to or less than one micron from each other.

7. A semiconductor wafer as set forth in claim 1 wherein said buffer structure is spaced from said outer boundary of said alignment marks by a distance of fifteen microns or less.

8. A semiconductor wafer as set forth in claim 7 wherein at least one of said alignment marks is located no more than twenty five microns from one of said chip areas.

9. A semiconductor wafer as set forth in claim 8 including a scribe line between said chip areas, wherein said set of alignment marks and said buffer structure are located within said scribe line.

10. A semiconductor wafer as set forth in claim 9 wherein said set of alignment marks and said buffer structure occupy an area not exceeding 10,000 $\mu m^2$.

11. A semiconductor wafer as set forth in claim 10 wherein said set of alignment marks and said buffer structure occupy an area not exceeding 5,000 $\mu m^2$.

12. A semiconductor wafer as set forth in claim 9 wherein said scribe line has a width less than or equal to 60 $\mu m$.

13. A semiconductor wafer as set forth in claim 12 wherein each of said set of alignment marks has a length less than or equal to twenty five microns.

14. A semiconductor wafer as set forth in claim 13, further comprising a second set of alignment marks parallel to said first set of alignment marks, located a distance of from 3 to 25 microns away from said first set of alignment marks.

15. A semiconductor wafer comprising:
    a plurality of chip areas;
    means for aligning a lithographic pattern on said semiconductor wafer, said means for aligning being located outside said plurality of chip areas and having an outer boundary; and
    means for buffering said aligning means comprising a plurality of grates, said buffering means located between said outer boundary of said means for aligning and said chip areas.

16. A semiconductor wafer as set forth in claim 15 wherein said buffering means includes a means for collecting contaminants.

17. A method for preserving an alignment structure on a semiconductor wafer, comprising the steps of;
    forming a buffer structure comprising a plurality of grates between the alignment structure and a first chip area and a second chip area such that the buffer structure is configured to prevent or inhibit fabrication materials and/or contaminants from adversely affecting the alignment structure; and
    performing at least one subsequent fabrication step on the semiconductor wafer.

18. A method as set forth in claim 17 wherein said performing step comprises chemical-mechanical polishing and/or photolithography.

19. A method as set forth in claim 18 further comprising forming a measurement structure on the semiconductor wafer.

20. A semiconductor wafer as set forth in claim 1, wherein said buffer structure is disposed adjacent to said outer boundary.

* * * * *

UNITED STATES PATENT AND TRADEMARK OFFICE
CERTIFICATE OF CORRECTION

| | | |
|---|---|---|
| PATENT NO. | : 6,172,409 B1 | Page 1 of 1 |
| APPLICATION NO. | : 08/883625 | |
| DATED | : January 9, 2001 | |
| INVENTOR(S) | : Hao Zhou | |

It is certified that error appears in the above-identified patent and that said Letters Patent is hereby corrected as shown below:

On Title Page, item (56) under 'References Cited' and 'U.S. PATENT DOCUMENTS', "5,401,961" should be changed to --5,401,691--.

Signed and Sealed this

Twenty-eighth Day of September, 2010

David J. Kappos
*Director of the United States Patent and Trademark Office*